United States Patent
Charley et al.

(10) Patent No.: US 10,103,705 B2
(45) Date of Patent: Oct. 16, 2018

(54) BST CAPACITOR

(71) Applicant: STMicroelectronics (Tours) SAS, Tours (FR)

(72) Inventors: Sylvain Charley, Mettray (FR); Aline Noire, St. Antoine du Rocher (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 377 days.

(21) Appl. No.: 14/632,981

(22) Filed: Feb. 26, 2015

(65) Prior Publication Data

US 2015/0243437 A1 Aug. 27, 2015

(30) Foreign Application Priority Data

Feb. 26, 2014 (FR) .................... 14 51547

(51) Int. Cl.
| | |
|---|---|
| H02M 3/06 | (2006.01) |
| H03H 7/38 | (2006.01) |
| H01G 7/06 | (2006.01) |
| H03H 5/12 | (2006.01) |
| H01G 4/38 | (2006.01) |

(52) U.S. Cl.
CPC ............... H03H 7/38 (2013.01); H01G 7/06 (2013.01); H01G 4/38 (2013.01); H03H 5/12 (2013.01); H03H 2210/025 (2013.01); H03H 2210/033 (2013.01)

(58) Field of Classification Search
CPC . H02M 3/07; H02M 3/18; H03K 3/53; H03K 3/537; G01R 15/14
USPC .......................................................... 307/109
See application file for complete search history.

(56) References Cited

U.S. PATENT DOCUMENTS

| | | | |
|---|---|---|---|
| 3,562,637 A | 2/1971 | Gikow | |
| 3,569,795 A | 3/1971 | Gikow | |
| 6,674,321 B1 * | 1/2004 | York | H01G 7/06 327/334 |
| 6,727,535 B1 | 4/2004 | Sengupta et al. | |
| 9,520,904 B2 * | 12/2016 | Horne | H03H 7/40 |
| 2004/0164819 A1 | 8/2004 | Mishima et al. | |
| 2004/0207456 A1 | 10/2004 | York | |
| 2008/0272851 A1 * | 11/2008 | Lin | H03B 5/1228 331/115 |
| 2009/0146498 A1 | 6/2009 | Kanno | |
| 2009/0310275 A1 * | 12/2009 | Katta | H01G 5/16 361/277 |
| 2010/0090760 A1 * | 4/2010 | Bachmann | H01L 29/93 327/586 |
| 2011/0134582 A1 | 6/2011 | Kanno | |
| 2012/0025921 A1 * | 2/2012 | Yang | H03B 5/1228 331/117 FE |
| 2012/0062338 A1 * | 3/2012 | Kanno | H01G 4/30 333/185 |
| 2012/0214421 A1 * | 8/2012 | Hoirup | H01Q 1/242 455/67.11 |

(Continued)

Primary Examiner — Quan Tra
(74) Attorney, Agent, or Firm — Seed IP Law Group LLP

(57) ABSTRACT

A capacitor having a capacitance settable by biasing, including: a series association of a plurality of first capacitive elements between two first terminals defining the capacitor electrodes; and two second terminals of application of bias voltages respectively connected, via resistive elements, to the opposite electrodes of each of the first capacitive elements.

14 Claims, 5 Drawing Sheets

(56) References Cited

U.S. PATENT DOCUMENTS

2015/0243442 A1* 8/2015 Kanno .................... H01G 7/06
307/104
2016/0133387 A1* 5/2016 Kanno .................... H01G 7/06
307/109

* cited by examiner

BST CAPACITOR

BACKGROUND

Technical Field

The present disclosure generally relates to electronic circuits and, more specifically, to capacitors having a value settable by application of a bias voltage. The present disclosure more specifically applies to BST (Barium-Strontium-Titanium) capacitors.

Description of the Related Art

BST capacitors have essentially been developed for radio applications, in particular for mobile telephony. Having a capacitor with an analogically-adjustable capacitance significantly improves the performance, since it enables to adapt the device comprising such a capacitor to the outer environment.

A BST capacitor appears in the form of an integrated circuit (this type of capacitor is also called adjustable integrated capacitor). The capacitance of a BST capacitor is set by the value of a D.C. bias potential which is applied thereto, generally in a range from a few volts to a few tens of volts, typically between 2 and 20 volts.

The bias voltage of a BST capacitor is generally provided by a dedicated control circuit, performing a high-voltage digital-to-analog conversion, that is, converting a digital configuration word (generally, a byte) into a D.C. analog voltage to be applied to the capacitor to set the capacitance thereof.

The reliability of a system using one or a plurality of BST capacitors depends on the reliability of the conversion of the set point value which may be affected by a drift in the matching between this set point value and the reached capacitance value.

BRIEF SUMMARY

An embodiment provides a capacitor having a capacitance settable by biasing which overcomes all or part of the disadvantages of usual capacitors.

An embodiment improves the reliability of the result of the conversion of a digital set point value into a capacitance value.

An embodiment compensates for possible drifts according to the programming history of a capacitor.

Thus, an embodiment provides a capacitor having a capacitance settable by biasing, comprising:

a series association of a plurality of first capacitive elements between two first terminals defining the electrodes of the capacitor; and two second terminals of application of bias voltages respectively connected, via respective elements, to the opposite electrodes of each of the first capacitive elements.

According to an embodiment, resistors connect the first capacitive elements two-by-two.

According to an embodiment, said resistors all have the same value.

According to an embodiment, the first capacitive elements all have the same value.

According to an embodiment, each first terminal is connected to said series association by a second capacitive element.

According to an embodiment, each second capacitive element has a capacitance of approximately 4 times the capacitance of a first capacitive element.

An embodiment also provides a method of controlling a capacitor having a capacitance settable by biasing, wherein a bias voltage, applied between two terminals of the capacitor, alternates between positive and negative values.

According to an embodiment, the value of the capacitance is determined by the absolute value of the bias voltage.

An embodiment also provides a capacitor control circuit, comprising terminals of application of bias voltages to the second terminals of the capacitors.

According to an embodiment, one of the second terminals of a plurality of capacitors is connected to a same terminal of application of the second bias voltage.

The foregoing and other features and advantages will be discussed in detail in the following non-limiting description of specific embodiments in connection with the accompanying drawings.

DETAILED DESCRIPTION

Figure 1:
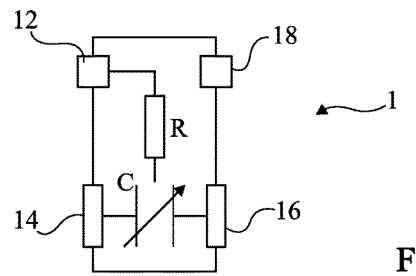
FIG. 1 is a simplified representation of a BST capacitor.

The same elements have been designated with the same reference numerals in the different drawings. For clarity, only those elements which are useful to the understanding of the embodiments which will be described have been shown and will be detailed.

In particular, the generation of the control signals, particularly digital, of a capacitor, has not been detailed, the described embodiments being compatible with usual solutions for generating such signals. Further, the different possible applications of a BST capacitor have not been detailed either, the described embodiments being here again compatible with usual applications. In the following description, expressions "approximately", "about", and "in the order of" mean to within 10% and preferably to within 5%.

FIG. 1 is a simplified representation of an integrated circuit 1 forming a capacitor having a capacitance settable by biasing, for example, a BST capacitor also known as PTIC. Circuit 1 generally comprises at least three terminals 12, 14, and 16. In practice, for industrial manufacturing reasons, it comprises a fourth terminal 18 which, in usual capacitors, is not intended to be connected. Terminals 14 and 16 define terminals corresponding to the electrodes of capacitor C intended to be connected to the radio application. Further, one of terminals 14 and 16 is grounded. According to the application, such a connection is either direct, or (case of a capacitor used in series with the radio frequency chain) achieved via an additional element (inductive or resistive). Terminal 12 defines a terminal of application of a bias voltage Vbias setting the value of the capacitance of capacitor C. From an electrical point of view, this bias potential is applied via a resistor R.

Figure 2:
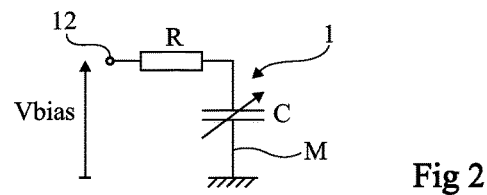
FIG. 2 is an equivalent electric diagram of a conventional capacitor having a capacitance settable by biasing.

FIG. 2 shows the equivalent electric diagram of a usual BST capacitor 1. The resistor of application of bias voltage Vbias forms, with capacitor C, a series RC circuit between terminal 12 of application of voltage Vbias and ground M.

Figure 3:
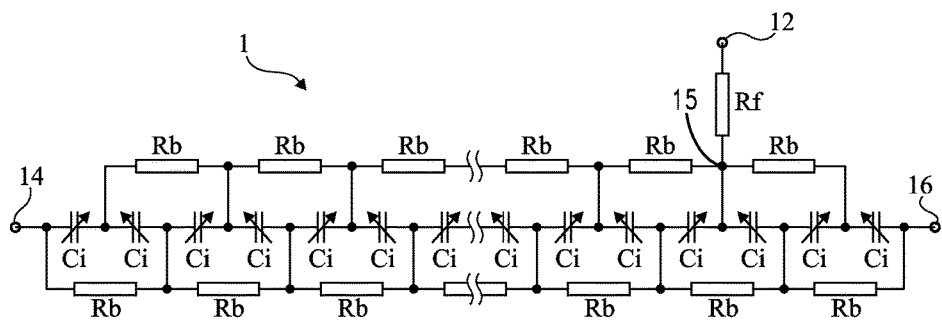
FIG. 3 is a detailed electric diagram of a conventional capacitor having a capacitance settable by biasing.

FIG. 3 shows an example of a detailed electric diagram of a known capacitor having a capacitance settable by biasing. Capacitor 1 comprises a plurality of capacitive elements Ci in series, for example, all having the same value. This series connection is achieved between terminals 14 and 16. The number of capacitive elements Ci conditions the linearity of the formed capacitor. The larger this number, the better the linearity of the radio frequency signal, this signal being divided between all capacitive elements Ci. For example, from 8 to 48 elements Ci are provided. Resistive biasing elements Rb connect capacitive elements Ci two by two. Thus, for a number n of capacitive elements Ci in series, capacitor 1 comprises n−1 resistors Rb. Although this is not compulsory, the number of capacitive elements Ci is generally even to optimize the integrated circuit surface area. A resistor Rf of application of signal Vbias connects terminal 12 to an interconnect between two of resistors Rb as well as to the junction point of the two capacitive elements Ci at the level of this interconnect. In the example of FIG. 3, starting from terminal 16, resistor Rf is connected between the third and fourth capacitive elements Ci, and thus to junction point 15 of the two resistors Rb which are in series between the junction point of the first and second capacitive elements and the junction point of the fifth and sixth capacitive elements.

In the example of FIG. 3, the orientation of the arrows on the capacitive elements symbolizes the biasing direction of the different elements. A reversal of the bias direction from one element to the next one is not indispensable but enables to decrease acoustic effects due to the material forming the capacitances and takes part in improving the linearity.

Figure 4:
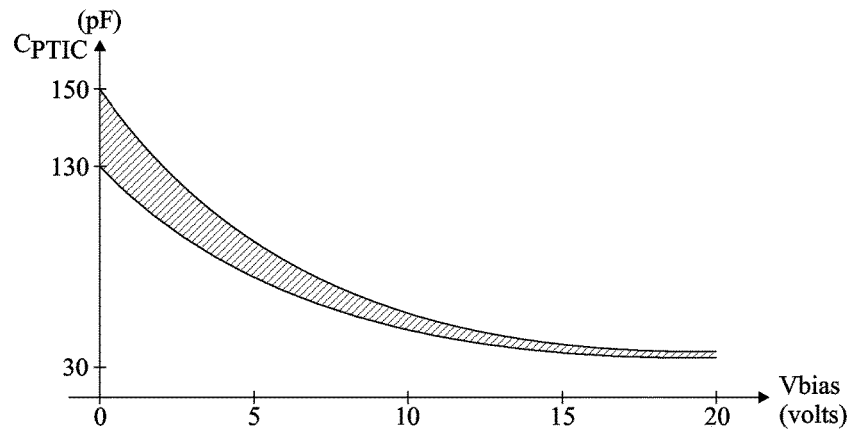
FIG. 4 is a graph illustrating the capacitance variation range of a BST capacitor according to its bias voltage.

FIG. 4 is a graph illustrating the variation of capacitance $C_{PTIC}$ of capacitor C according to voltage Vbias of the biasing. It is an example of a capacitor, having its value desired to be adjusted on a range from approximately 30 to 150 picofarads according to an applied bias voltage.

This graph shows a phenomenon which has been observed by the inventors. For a given bias value, the resulting capacitance taken by the capacitor may vary in a non-negligible way. Such a variation may reach some ten percents (hatched area in FIG. 4).

The inventors have also observed that, when the BST capacitor has not been used for a few hours, the capacitance variation according to the voltage follows the upper curve of the diagram of FIG. 4. As the capacitor undergoes successive control operations, particularly over short periods, the variation of capacitance $C_{PTIC}$ according to the voltage tends to draw closer to the lower curve. Actually, a relaxation effect can be observed when the capacitor is not in use. This phenomenon, generally called "hysteresis" is due to the very structure of BST capacitors and to the behavior of the ferroelectric materials forming them.

Current constraints, in terms of frequency and of rapidity of the change of value of a BST capacitor (at least without waiting for several hours), result in a lack of accuracy in the capacitance values obtained by biasing.

The inventors have however observed that applying a negative biasing to the BST capacitor decreases the adverse effect mentioned hereabove, that is, the capacitance relaxation effect is accelerated, which enables to rely on a desired bias voltage-to-capacitance conversion.

Moreover, the variation of the capacitance value is symmetrical with respect to a zero bias voltage. Thus, a biasing under a negative voltage provides the same value as a positive bias voltage.

Figure 5:
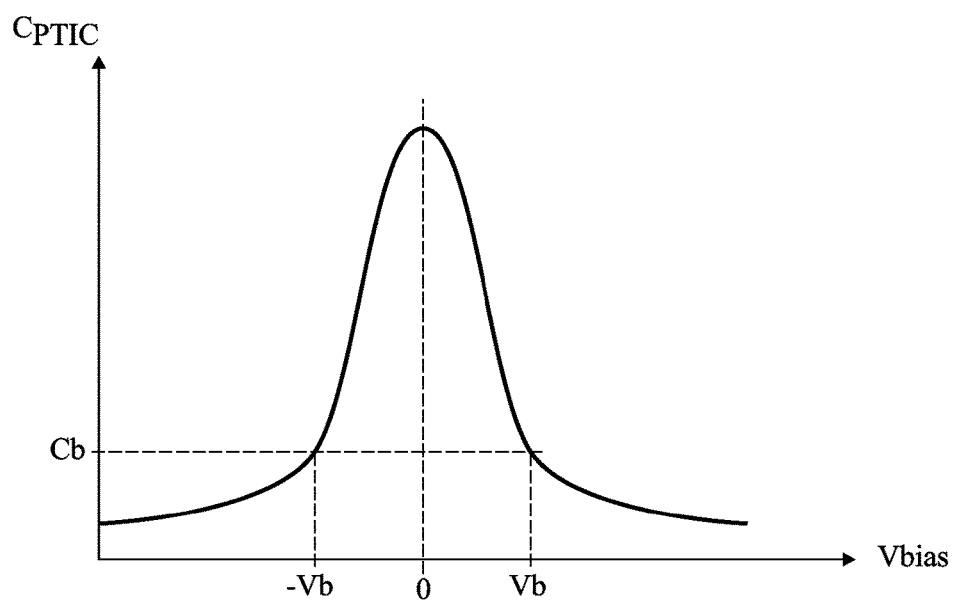
FIG. 5 is another graph showing the capacitance variation range of a BST capacitor according to its bias voltage.

FIG. 5 illustrates this phenomenon. This drawing shows an example of characteristic of capacitance $C_{PTIC}$ according to bias voltage Vbias. As can be observed, capacitance $C_{PTIC}$ takes an identical value Cb for a same absolute value Vb of voltage Vbias. This phenomenon is exploited to make the obtained capacitance values reliable, and more particularly to improve the reliability of the set point value-to-capacitance conversion.

More specifically, biasings under a positive and negative voltage are alternated to avoid a drift in the conversion result.

Figure 6:
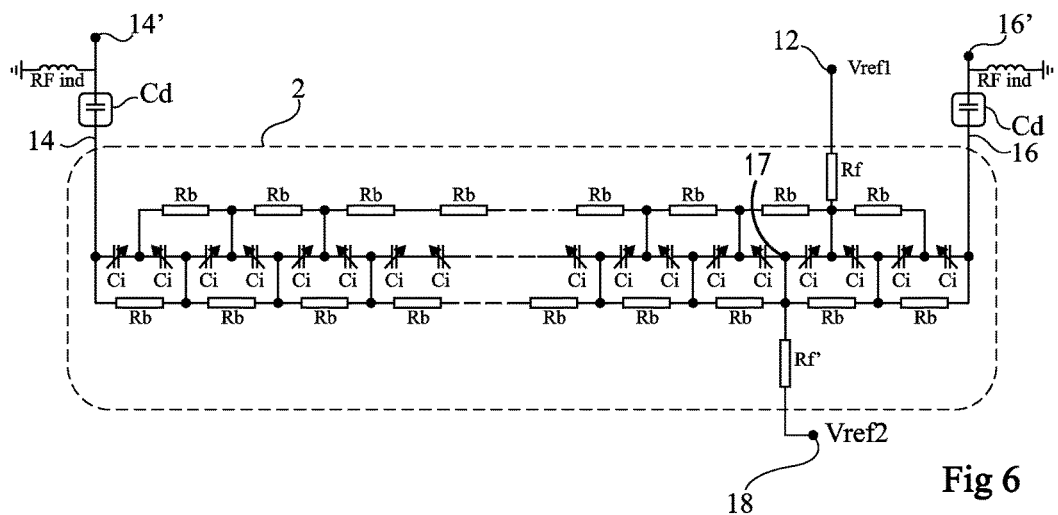
FIG. 6 is an equivalent electric diagram of an embodiment of a capacitor having a capacitance settable by biasing.

FIG. 6 shows an embodiment of a capacitor having a capacitance adjustable by biasing.

As compared with a conventional capacitor 1 (FIG. 3), a first positive voltage Vref1 is applied to terminal 12 and a second positive voltage Vref2 is applied to another node of the series association of capacitive elements Ci. For example, a resistor Rf' of application of voltage Vref2 connects terminal 18 usually not connected to the integrated circuit at junction point 17 of, in this example, the fourth and fifth capacitive elements Ci. This amounts to applying a voltage Vbias equal to Vref1-Vref2 across each of capacitive elements Ci.

It should be noted that the node of application of bias voltages Vref1 and Vref2 in the series association of the different capacitive elements Ci is of no importance, provided that the two voltages are applied to opposite electrodes of the capacitive elements. In other words, it can be considered that voltage Vref1 is applied to an odd node while voltage Vref2 is applied to an even node. Considering the capacitor as a whole, this amounts to connecting terminals 12 and 18 of application of voltages Vref1 and Vref2, via resistive elements Rf and Rf' (and one or a plurality of resistors Rb, depending on the position of the capacitive element relative to terminal 12 and 18), to the opposite electrodes of each of the capacitive elements.

It could have been devised to apply a negative voltage to terminal 12 to obtain the effect of a zero average biasing value and thus cancel possible drifts. This however complicates the control and generates a negative bias voltage.

The solution advocated by the described embodiments enables to bias the capacitor by only applying positive voltages to terminals 12 and 18, while obtaining the expected effect of a biasing under a negative voltage.

In the example of FIG. 6, additional capacitive elements Cd are provided between terminals 14 and 16 of integrated capacitor 2 and terminals 14' and 16' intended to receive the radio frequency signal. The function of capacitors Cd, here external to circuit 2, is to filter the D.C. component introduced by the application of reference voltage Vref2, terminal 18 of application of voltage Vref2 only being separated from terminals 14 and 16 by resistive elements. As for voltage Vref1, the first and last elements Ci of the series association separate terminal 12 from terminals 14 and 16 and take part in the filtering of this D.C. component.

In the example of FIG. 6, capacitor 2 is assumed to be interposed in the radio frequency transmission chain. Accordingly, terminals 14' and 16' are grounded via inductive elements RFind.

Figure 7:
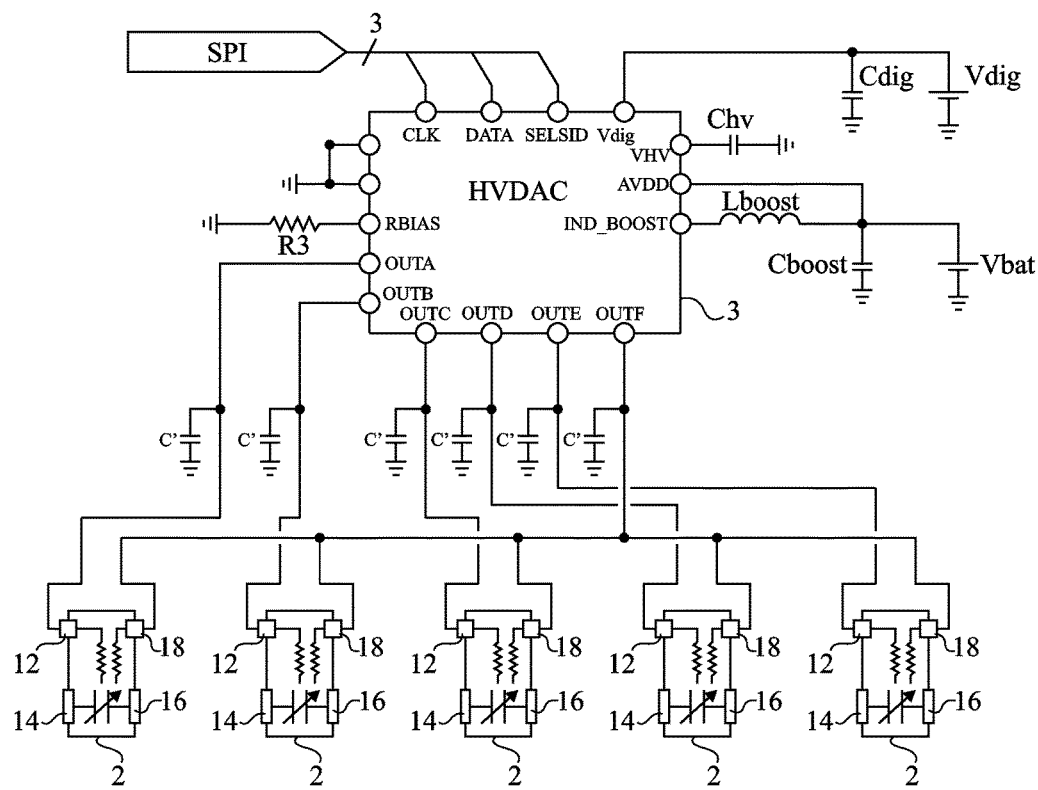
FIG. 7 is a simplified representation of an embodiment of a BST capacitor control circuit of the type illustrated in FIG. 6.

FIG. 7 is a simplified representation of a control circuit 3 in the form of an integrated high-voltage digital-to-analog converter (HVDAC). Two voltages, respectively a digital power supply voltage Vdig (for example, 1.8 volts), and an analog power supply voltage Vbat (for example, 3.6 volts), are applied to terminals Vdig and AVDD of circuit 3. A filtering element Cdig may be connected between terminal Vdig and the ground. The digital set point value (data word) originates from other circuits, not shown, of the application and is, in this example, provided by a serial bus SPI of three respective clock, data, and synchronization conductors connected to terminals CLK, DATA, and SELSID of circuit 3. A terminal IND BOOST receives voltage Vbat via an inductive element Lboost and a capacitor Cboost is connected in parallel on voltage Vbat. This assembly has the function of powering a voltage step-up stage generating the voltage (for example, in the range from 2 to 20 volts) to control capacitors 2 connected to circuit 3. A resistor R3 grounds a terminal RBIAS and a capacitor Chv grounds a terminal VHV (receiving the high voltage generated by the step-up stage). Such usual elements form elements for biasing circuit 3. Other terminals of this circuit are capable of being further grounded. The representation of FIG. 7 is an arbitrary example and other control circuits may apply to the described embodiments.

In the example of FIG. 7, circuit 3 comprises six output terminals OUTA, OUTB, OUTC, OUTD, OUTE, and OUTF intended to control five BST capacitors 2. Terminals OUTA to OUTE are connected to the respective terminals 12 of capacitors 2 while terminal OUTF is common to all capacitors 2 while being connected between their terminals 18. Filtering capacitors C' ground terminals OUTA, OUTB, OUTC, OUTD, OUTE, and OUTF. Respective terminals 14 and 16 of the different capacitors 2 form input/output terminals of radio frequency signals to be respectively processed by these different capacitors.

Figure 8A:
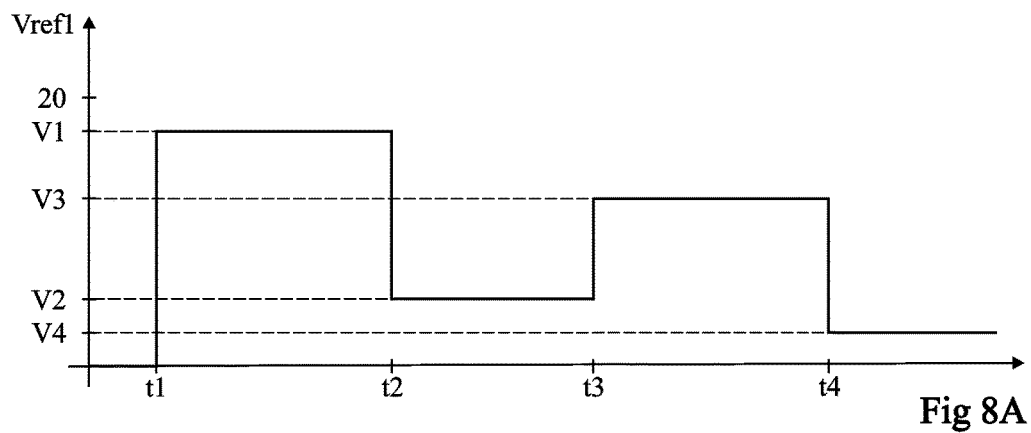
FIGS. 8A, 8B, 8C, and 8D illustrate the operation of a capacitor of FIG. 6, controlled by the circuit of FIG. 7.
Figure 8B:
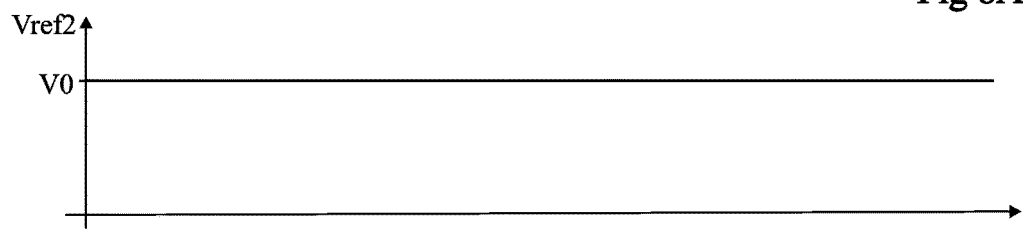
Figure 8C:
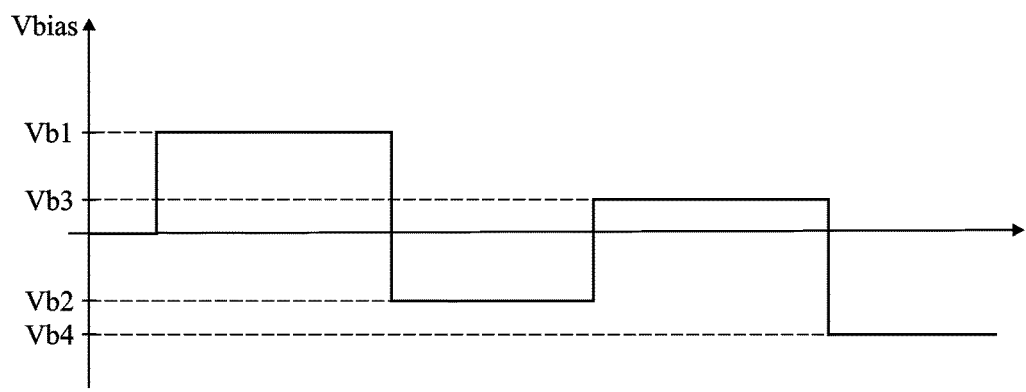
Figure 8D:
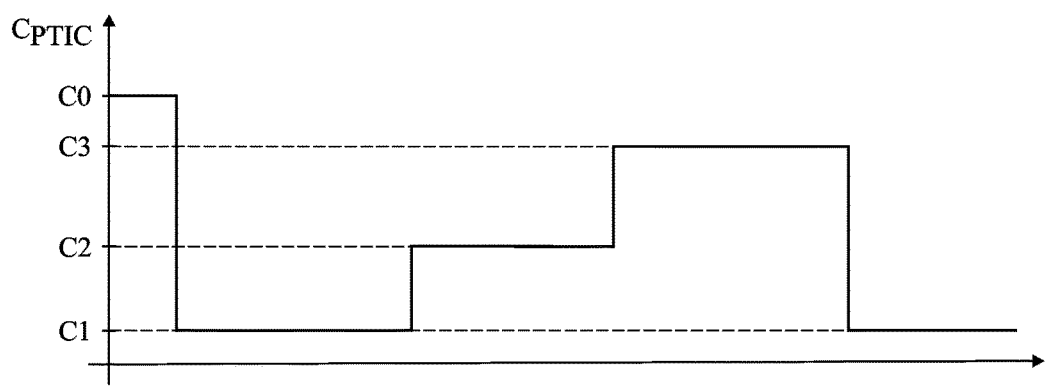

FIGS. 8A, 8B, 8C, and 8D illustrate the operation of the method of biasing a BST capacitor such as shown in FIG. 6 by a circuit of the type in FIG. 7. FIG. 8A is a timing diagram illustrating an example of values taken by value Vref1 applied to terminal 12. FIG. 8B illustrates an example of the shape of voltage Vref2 applied to terminal 18. Voltages Vref1 and Vref2 are referenced relative to ground. FIG. 8C illustrates the shape of voltage Vbias corresponding to the difference between voltages Vref1 and Vref2. FIG. 8D illustrates the capacitance values $C_{PTIC}$ obtained by the biasing under voltage Vbias.

It is assumed that at a time t1, it is desired to pass from quiescent value C0 (zero voltage Vbias), which corresponds to the maximum value that can be reached by capacitance $C_{PTIC}$, to a first relatively low capacitance value C1, which, according to the graph of FIG. 4, imposes applying a relatively high voltage Vbias.

In the example of FIGS. 8A to 8D, voltage Vref2 applied to terminal 18 is constant and keeps a same positive value V0. Thus, voltage Vbias switches from a positive value to a negative value according to the difference between voltage Vref1 and voltage Vref2.

In the example of FIGS. 8A to 8D, it is assumed that between times t1 and t2, a voltage V1, which is positive and greater than voltage V0, is applied to terminal Vref1. This results in a bias voltage Vb1 across the capacitor and a first value C1 of capacitance $C_{PTIC}$. Between times t2 and t3, a second value V2 of voltage Vref1 is applied. Value V2 is for example smaller than value V0 so that the difference results in a negative value Vb2 of bias voltage Vbias. In the arbitrary example taken in the drawings, voltage Vb2 is smaller than voltage Vb1 in absolute value, so that the obtained value of capacitance C2 is greater than value C1. Between times t3 and t4, a voltage Vref1 having a value V3, intermediate between values V1 and V2, but greater than value V0, is assumed. This results in a bias voltage Vb3 having an absolute value smaller than voltage Vb2 and in a third capacitance value C3. After time t4, the application of a voltage Vref1 having a value V4 such that the absolute value of the difference between voltages V0 and V4 is equal to the absolute value of the difference between voltages V1 and V0 is assumed. This results in a negative bias voltage Vb4 equal to the absolute value of voltage Vb1. Accordingly, the capacitance taken by capacitor 2 is value C1.

FIGS. 8A to 8D illustrate that by alternating passages through positive and negative values of bias voltage Vbias, drifts in the result of the set point voltage-to-capacitance conversion are avoided.

Figure 9:
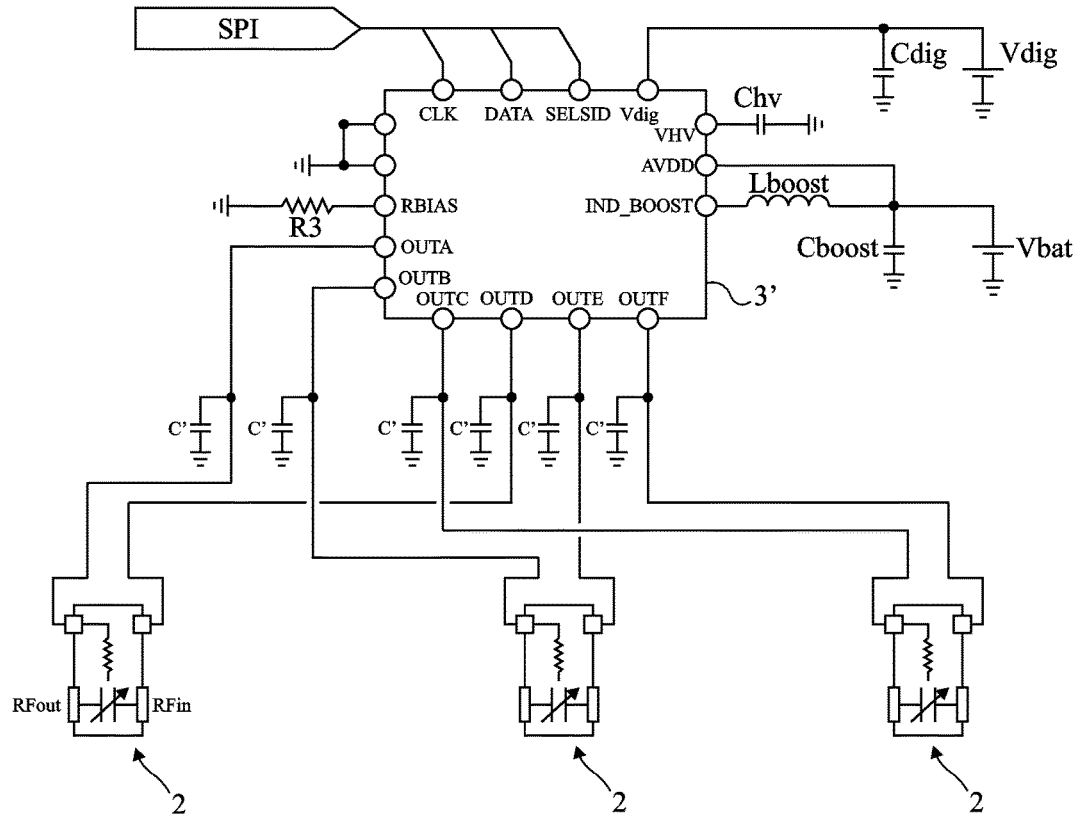
FIG. 9 is a simplified representation of another embodiment of a control circuit.

FIG. 9 is a simplified electric diagram of another embodiment of a circuit 3' for controlling capacitor 2. As compared with the embodiment of FIG. 7, the difference is that it is provided to assign, to terminals 18 of the three capacitors 2, terminals OUTD, OUTE, and OUTF of circuit 3' which are different from one another. The control of capacitors 2 is more individual and allows a greater variation.

However, an advantage of the embodiment of FIG. 7 is that with a voltage V0(Vref2) common to all capacitors, the generation of this voltage and that of the control circuit are simplified. Voltage Vref1 applied to the different capacitors is sufficient to differentiate the values of the obtained capacitances.

Figure 10:
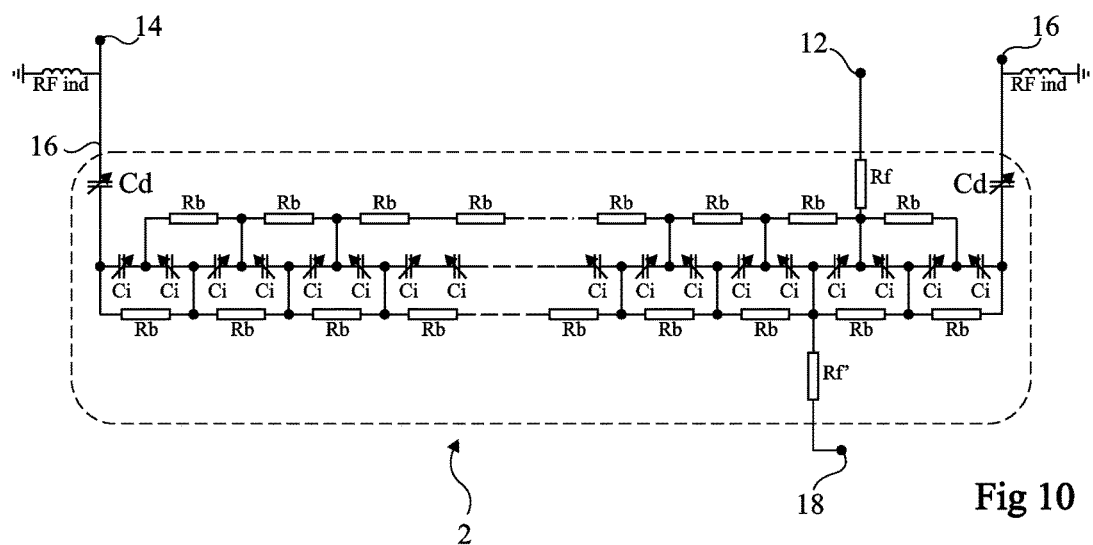
FIG. 10 shows the electric diagram of an alternative BST capacitor.

FIG. 10 shows an alternative embodiment of a capacitor 2 where decoupling capacitors Cd are integrated in circuit 2 (and not external as in the embodiment of FIG. 6).

As a specific embodiment, the value of capacitances Cd shows in the order of four times the values of individual capacitive elements Ci integrated in capacitor 2.

An advantage of the embodiments which have been described is that it is now possible to reliabilize the conversion between digital and then analog control set point values of a BST capacitor.

Another advantage is that using a differential biasing simplifies the voltage generation. In particular, the implementation of the described embodiments does not generate a voltage which is negative with respect to ground.

Various embodiments have been described. Various alterations, modifications, and improvements will readily occur to those skilled in the art. In particular, the sizing of individual capacitive elements Ci as well as of individual biasing resistors Rb is within the abilities of those skilled in the art based on the functional indications given hereabove and by applying techniques usual per se. Further, although the control circuits have been described in relation with an example comprising six output terminals, other embodiments are possible according to the number of BST capacitors to be controlled. Similarly, the generation of the control instructions so as to alternate positive and negative biasings is within the abilities of those skilled in the art based on the functional indications given hereabove. Further, although reference has been made to an alternation of positive and negative bias voltages, it may be provided to keep positive values for a few occurrences and negative values during other occurrences (preferably, less than 10 occurrences each time).

Such alterations, modifications, and improvements are intended to be part of this disclosure, and are intended to be within the spirit and the scope of the present disclosure.

Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A device, comprising:
a barium strontium titanium (BST) capacitor having a capacitance that is configured to be set by biasing, the BST capacitor including:
a first terminal;
a second terminal;
a plurality of first capacitive elements, each of the plurality of first capacitive elements including a first electrode and a second electrode, the plurality of first capacitive elements arranged in series between the first and second terminals;
a plurality of first resistive elements coupled to the plurality of first capacitive elements, each of the plurality of first resistive elements coupled to the first electrode of one of the plurality of first capacitive elements and the second electrode of a sequential one of the plurality of first capacitive elements;
a second resistive element coupled to the first electrode of each of the plurality of first capacitive elements;
a third resistive element coupled to the second electrode of each of the plurality of first capacitive elements;
a third terminal coupled to the second resistive element;
a fourth terminal coupled to the third resistive element;
a second capacitive element coupled between the first terminal and the plurality of first capacitive elements;
a first inductor coupled between the second capacitive element and ground;
a third capacitive element coupled between the second terminal and the plurality of first capacitive elements; and
a second inductor coupled between the third capacitive element and ground; and
a control circuit including:
a first output coupled to the third terminal; and
a second output coupled to the fourth terminal, the control circuit, in operation, applies a bias voltage between the third and fourth terminals, and alternates the bias voltage between positive and negative values, the bias voltage being set to the positive and negative values by outputting positive voltages from the first and second outputs.

2. The device of claim 1 wherein the plurality of first resistive elements couples the first capacitive elements two by two.

3. The device of claim 2 wherein the plurality of first resistive elements all have the same value.

4. The device of claim 1 wherein the plurality of first capacitive elements all have the same value.

5. The device of claim 1 wherein the second capacitive element has a capacitance of approximately 4 times the capacitance of one of the plurality of first capacitive elements.

6. A method, comprising:
setting a capacitance of a barium strontium titanium (BST) capacitor to a plurality of capacitance values, the BST capacitor including:
a first terminal;
a second terminal;
a plurality of first capacitive elements, each of the plurality of first capacitive elements including a first electrode and a second electrode, the plurality of first capacitive elements arranged in series between the first and second terminals of the BST capacitor;
a plurality of first resistive elements coupled to the plurality of first capacitive elements, each of the plurality of first resistive elements coupled to the first electrode of one of the plurality of first capacitive elements and the second electrode of a sequential one of the plurality of first capacitive elements;
a second resistive element coupled to the first electrode of each of the plurality of first capacitive elements;
a third resistive element coupled to the second electrode of each of the plurality of first capacitive elements;
a third terminal coupled to the second resistive element; and
a fourth terminal coupled to the third resistive element, the third and fourth terminals being coupled to the first and second electrodes, respectively, of the plurality of first capacitive elements, setting the capacitance of the BST capacitor including:
setting the capacitance of the BST to a first capacitance value by applying a bias voltage having a first positive value between the third and fourth terminals;
changing the capacitance of the BST capacitor from the first capacitance value to a second capacitance value by switching the bias voltage from the first positive value to a first negative value; and
changing the capacitance of the BST capacitor from the second capacitance value to a third capacitance value by switching the bias voltage from the first negative value to a second positive value, the bias voltage being set to the first positive value, the first negative value, and the second positive value by applying positive voltages to the third and fourth terminals.

7. The method of claim 6 wherein the value of the capacitance is determined by the absolute value of the bias voltage.

8. A system, comprising:
a plurality of barium strontium titanium (BST) capacitors, each of the plurality of BST capacitors including:
a first terminal, a second terminal, third terminal, and a fourth terminal;
a plurality of first capacitive elements, each of the plurality of first capacitive elements including a first electrode and a second electrode, the plurality of first capacitive elements arranged in series between the first and second terminals; and
a plurality of first resistive elements coupled to the plurality of first capacitive elements, each of the plurality of first resistive elements coupled to the first electrode of one of the plurality of first capacitive elements and the second electrode of a sequential one of the plurality of first capacitive elements;
a second capacitive element coupled between the first terminal and the plurality of first capacitive elements, the second capacitive element having a capacitance that is larger than each of the plurality of first capacitive elements;

a first inductor coupled between the second capacitive element and ground;

a third capacitive element coupled between the second terminal and the plurality of first capacitive elements, the third capacitive element having a capacitance that is larger than each of the plurality of first capacitive elements; and a second inductor coupled between the third capacitive element and ground a control circuit having a first output terminal and a plurality of second output terminals, the first output terminal being coupled to each of the third terminals of the plurality of BST capacitors, each of the plurality of second output terminals coupled to a respective one of the fourth terminals of the plurality of BST capacitors, the control circuit, in operation, applies first and second bias voltages to the third and fourth terminals, respectively, of the plurality of BST capacitors.

9. The system of claim 8 wherein the third terminals of the plurality of BST capacitors are coupled to each other.

10. The system of claim 8 wherein each of the plurality of BST capacitors further includes:

a second resistive element coupled to the third terminal and the first electrode of each of the plurality of first capacitive elements; and a third resistive element coupled to the fourth terminal and the second electrode of each of the plurality of first capacitive elements.

11. The system of claim 8 wherein the first and second bias voltages have positive values.

12. The device of claim 1 wherein the second voltage has a constant value, and the first voltage alternates between a value that is greater than the constant value and a value that is less than the constant value.

13. The method of claim 6 wherein the BST capacitor includes:

a second capacitive element coupled between the first terminal and the plurality of first capacitive elements;

a first inductive element coupled between the second capacitive element and ground;

a third capacitive element coupled between the second terminal and the plurality of first capacitive elements; and a second inductive element coupled between the third capacitive element and ground.

14. The system of claim 8 wherein the second capacitive element has a capacitance that is approximately four times larger than each of the plurality of first capacitive elements, and the third capacitive element has a capacitance that is approximately four times larger than each of the plurality of first capacitive elements.

* * * * *